(12) United States Patent
Saito et al.

(10) Patent No.: US 6,171,104 B1
(45) Date of Patent: Jan. 9, 2001

(54) OXIDATION TREATMENT METHOD AND APPARATUS

(75) Inventors: Yukimasa Saito, Sagamihara; Hiroyuki Yamamoto, Hino, both of (JP)

(73) Assignee: Tokyo Electron Limited, Tokyo-To (JP)

( * ) Notice: Under 35 U.S.C. 154(b), the term of this patent shall be extended for 0 days.

(21) Appl. No.: 09/369,371

(22) Filed: Aug. 6, 1999

(30) Foreign Application Priority Data

Aug. 10, 1998 (JP) ................................. 10-225492

(51) Int. Cl.[7] ..................................... F27B 9/12
(52) U.S. Cl. .............................. 432/18; 432/2; 432/128; 438/770
(58) Field of Search ...................... 432/2, 17, 18, 432/128, 241; 438/558, 563, 763, 770, 773, 778; 118/715

(56) References Cited

U.S. PATENT DOCUMENTS

| | | | |
|---|---|---|---|
| 5,273,423 | * 12/1993 | Shiraiwa | 432/2 |
| 5,330,352 | * 7/1994 | Watanabe et al. | 432/241 |
| 5,750,436 | * 5/1998 | Yamaga et al. | 438/558 |
| 5,961,323 | * 10/1999 | Lee | 432/241 |

FOREIGN PATENT DOCUMENTS 63-210501   9/1988   (JP) .

* cited by examiner

*Primary Examiner*—Denise L. Ferensic
*Assistant Examiner*—Gregory A. Wilson
(74) *Attorney, Agent, or Firm*—Smith, Gambrell & Russell, LLP

(57) ABSTRACT

In a method wherein semiconductor wafers are accommodated within a treatment furnace that has been heated beforehand to a predetermined temperature, the temperature within the treatment furnace is increased to a predetermined treatment temperature, and the semiconductor wafers are subjected to an oxidation treatment, the temperature-increasing step is performed under a reduced pressure. This makes it possible to suppress the formation of natural oxide films during the temperature-increasing step, and thus makes it possible to form an extremely thin film of a superior quality on the semiconductor wafer.

11 Claims, 5 Drawing Sheets

OXIDATION TREATMENT METHOD AND APPARATUS

BACKGROUND OF THE INVENTION

1. Technical Field

The present invention relates to an oxidation treatment method and an oxidation treatment apparatus for an object to be treated, such as a semiconductor wafer.

2. Description of Related Art

The process of fabricating a semiconductor device, for example, includes an oxidation treatment step for forming an oxide film on the surfaces of a semiconductor wafer that is an object to be treated, and one method of performing such an oxidation treatment is a method of oxidizing a semiconductor wafer by bringing it into contact with water steam at a predetermined temperature within a treatment furnace (wet oxidation). To perform this oxidation treatment, an oxidation treatment apparatus is known in which a combustion device which causes hydrogen and oxygen to react (combust) and generate water steam is provided independently outside the treatment furnace, and the water steam generated by this combustion chamber is supplied into the treatment furnace to perform the oxidation treatment, as disclosed in Japanese Patent Application Laid-Open No. 63-210501, for example.

In the prior-art oxidation treatment apparatus, the treatment is preformed with the interior of the treatment furnace being controlled to a very slightly reduced pressure, such as approximately $-5$ mm $H_2O$ to $-10$ mm $H_2O$ with respect to atmospheric pressure (760 Torr) by a factory exhaust system. Since there is a large number of portions that are not leak-tight (hermetically sealed) among the seal portions of the entire system, it is therefore not possible to employ a vacuum evacuation method, even if the atmosphere within the treatment furnace is replaced (purged) with an inert gas, and a method is employed to push out any gases remaining within the treatment furnace by supplying inert gas thereto.

However, in the prior-art oxidation treatment apparatus or oxidation treatment method, it is not possible for an inert gas purge within this method to satisfactorily remove all the factors that will cause the formation of natural oxides, so that when an oxidation treatment is performed by accommodating a semiconductor wafer within a treatment furnace that has been heated beforehand to a predetermined temperature, increasing the temperature within the treatment furnace to a predetermined treatment temperature, and supplying a treatment gas thereto, for example, a problem occurs in that natural oxide films are formed readily in this temperature-increasing step. In addition, as semiconductor devices become even smaller, there is an increasing demand for even thinner oxide films, but the prior-art oxidation treatment apparatus or oxidation treatment method has reached a limit in the formation of superior-quality thin oxide films with uniform film quality and film thickness, due to the occurrence of unwanted natural oxides, which means that the thickness of oxide films obtained thereby has reached a limit on the order of 5 nm.

The present invention was devised in the light of the above described circumstances and has as an object thereof the provision of an oxidation treatment apparatus and oxidation treatment method which are capable of satisfactorily suppressing the formation of natural oxides during a temperature-increasing step, and which are capable of forming an extremely thin oxide film of a superior quality.

SUMMARY OF THE INVENTION

To achieve the above object, the oxidation treatment method in accordance with this invention comprises the steps of: accommodating an object to be treated within a treatment furnace that has been heated beforehand to a predetermined first temperature; raising the temperature within the treatment furnace to a predetermined second temperature for a predetermined treatment, which is higher than the first temperature; and subjecting the object to be treated to an oxidation treatment by supplying a treatment gas into the treatment furnace; wherein: the oxidation treatment method further comprises a step of reducing the pressure within the treatment furnace, during the step of raising the temperature to the second temperature.

This method may further comprise a step of reducing the pressure within the treatment furnace, after the oxidation treatment step.

The pressure reducing step may comprise a cycling purge of alternately repeating the supply and halting of an inert gas into the interior of the treatment furnace, while the interior of the treatment furnace is being evacuated.

Another aspect of this invention relates to an oxidation treatment method comprising the steps of: accommodating an object to be treated within a treatment furnace; and subjecting the object to be treated to an oxidation treatment at a predetermined temperature by supplying a treatment gas into the treatment furnace; wherein: the oxidation treatment method further comprises a step of evacuating the interior of the treatment furnace, before the oxidation treatment step.

This method may further comprise a step of reducing the pressure within the treatment furnace, after the oxidation treatment step.

This method may further comprise a diffusion treatment step performed by supplying nitric oxide or nitrous oxide to the interior of the treatment furnace, after the oxidation treatment step.

The above evacuating step may comprise a cycling purge of alternately repeating the supply and halting of an inert gas into the interior of the treatment furnace, while the interior of the treatment furnace is being evacuated.

An oxidation treatment apparatus in accordance with this invention comprises: a treatment furnace for accommodating an object to be treated; means for maintaining the interior of the treatment furnace at a predetermined treatment temperature; and means for subjecting the object to be treated to an oxidation treatment at a predetermined temperature by supplying a treatment gas into the interior of the treatment furnace; wherein the oxidation treatment apparatus further comprises: a factory exhaust system for exhausting the interior of the treatment furnace at a predetermined exhaust pressure; a vacuum exhaust system for evacuating the interior of the treatment furnace to a pressure that is lower than the exhaust pressure of the factory exhaust system; and switching means for switching between the factory exhaust system and the vacuum exhaust system.

The vacuum exhaust system may further comprise a multiple-function valve capable of opening, closing, and adjusting pressure; and a vacuum pump.

The oxidation treatment apparatus in accordance with this invention may comprise: a treatment furnace for accommodating an object to be treated; means for maintaining the interior of the treatment furnace at a predetermined treatment temperature; and means for subjecting the object to be treated to an oxidation treatment at a predetermined temperature by supplying a treatment gas into the interior of the treatment furnace; wherein the oxidation treatment apparatus further comprises: a vacuum exhaust system having a vacuum pump for reducing the pressure in the interior of the treatment furnace; and a multiple-function valve provided in the vacuum exhaust system and capable of opening, closing, and adjusting pressure within a range from atmospheric pressure to a vacuum pressure.

BEST MODE FOR CARRYING OUT THE INVENTION

Figure 1:
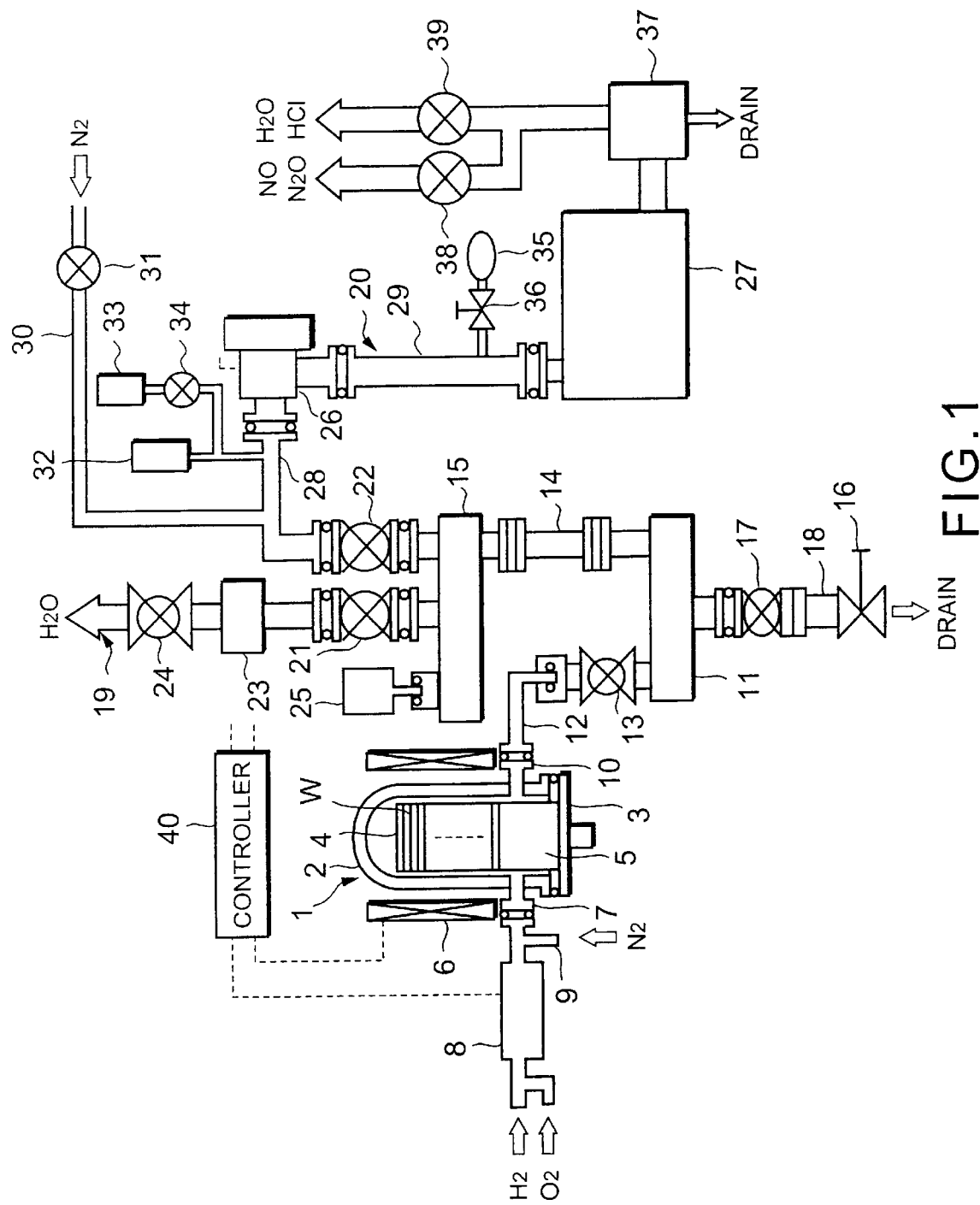
FIG. 1 is a side view of the entire structure of an oxidation treatment apparatus in accordance with a first embodiment of this invention.

Embodiments of the present invention will be described below, with reference to the accompanying drawings. The entire structure of an oxidation treatment apparatus in accordance with a first embodiment of the present invention is shown in FIG. 1, where reference number 1 denotes a vertical batch-processing type of treatment furnace such that this treatment furnace 1 accommodates semiconductor wafers W that are objects to be treated, supplies a treatment gas thereto, and performs an oxidation treatment thereon at a high temperature of, for example, 850° C. This treatment furnace 1 is formed of a reaction tube 2 having a vertical cylindrical form made of a thermally resistant material such as quartz, with an upper end thereof sealed and a lower end thereof open.

This reaction tube 2 is constructed so as to configure the treatment furnace 1, which is tightly sealed, by a lid 3 that hermetically seals a lower aperture portion that is opened to form a furnace entrance. A substrate support device, such as a wafer boat 4 made of quartz, holds a large number of semiconductor wafers W, such as approximately 150 wafers, in a horizontal state and at a spacing in the vertical direction. The wafer boat 4 is mounted on top of the lid 3 with an insulating tube 5 therebetween.

The lid 3 is configured in such a manner that it loads (conveys inward) and unloads (conveys outward) the wafer boat 4 with respect to the treatment furnace 1, and also opens and closes the furnace entrance, by means of an elevator mechanism (not shown in the figure). A heater 6 capable of controlling the heating of the interior of the furnace to a temperature of, for example, from 300 to 100° C. is provided around the reaction tube 2. A suitable number of gas introduction pipe portions 7 is provided on a lower side of the reaction tube 2, to one of which is connected a combustion device 8 that acts as a treatment gas supply means (water-steam supply means) for generating and supplying water steam produced by combustion reaction between hydrogen ($H_2$) and oxygen ($O_2$).

The combustion device 8 is preferably configured in such a manner that it is capable of supplying an extremely small flowrate of water steam, such as a flowrate of 0.6 to 0.3 liters/minute instead of the 6 liters/minute (minimum) in the prior art, by means such as a reduction in the diameter of combustion nozzles or a modification of the shape of the combustion nozzles. In addition, an inert gas supply portion 9 is provided within the combustion device 8 for supplying an inert gas such as nitrogen ($N_2$) for diluting the water steam. Note that a gas supply source (not shown in the figure) is connected to another gas introduction pipe portion, to supply either another treatment gas such as nitric oxide (NO) or nitrous oxide ($N_2O$) or an inert gas such as nitrogen ($N_2$) thereto.

An exhaust pipe portion 10 is provided on a lower side wall of the reaction tube 2 for exhausting the interior of the reaction tube 2 and a first duct 11 is connected to this exhaust pipe portion 10 via a quartz exhaust pipe 12 for removing drain water that is generated by condensation of the water steam during the exhaust. A ball valve 13 may also be provided between the exhaust pipe 12 and the first duct 11. A second duct 15 is connected to the first duct 11 by a water-cooled condensate pipeline 14 rising upward therefrom, together with a manual valve 16 for removing drain water that has accumulated within the first duct 11. A pneumatic control valve 17 and a trap 18 are preferably provided between the first duct 11 and the manual valve 16.

A factory exhaust system 19, which exhausts the interior of the treatment furnace 1 in the previously described oxidation treatment step, and a vacuum exhaust system 20, which is capable of introducing an inert gas such as $N_2$ while the interior of the treatment furnace 1 is being evacuated before and after the previously described oxidation treatment step, are connected by pneumatic control valves 21 and 22, which are switching means, to the second duct 15. An exhaust pressure control valve 23 for controlling the exhaust pressure to a predetermined pressure, such as from −5 mm $H_2O$ to −10 mm $H_2O$ with respect to atmospheric pressure (760 Torr), is provided in the factory exhaust system 19. A ball valve 24 may be provided downstream of this exhaust pressure control valve 23. The first and second ducts 11 and 15 are preferably made of a material having corrosion resistance such as Teflon (trademark). In addition, it is preferable to provide a pressure switch 25 in the second duct 15 to detect a state of normal pressure (atmospheric pressure) or a pressure higher than normal and issue a warning.

A multiple-function valve 26 which is capable of opening, closing, and adjusting pressure and a vacuum pump 27 which is capable of reducing the pressure within the treatment furnace 1 to a maximum of, for example, approximately $10^{-3}$ Torr, are provided in the vacuum exhaust system 20. A dry pump may be used for the vacuum pump 27, by way of example. The switching valve 22 of the second duct 15 and the multiple-function valve 26 are connected by a first pipeline 28, and the multiple-function valve 26 and the vacuum valve 27 are connected by a second pipeline 29. The first and second pipelines 28 and 29 are preferably made of a material having corrosion resistance such as Teflon (trademark) or stainless steel and, if they are made of stainless steel, it is preferable that a heater capable to heating to approximately 150° C. is provided to remove moisture. This is because, if moisture were to remain, it would react with the nitric oxide (NO) or nitrous oxide ($N_2O$) used during the diffusion processing, and thus generate nitric acid ($HNO_3$) which is highly corrosive.

An inert gas supply pipe 30 is connected to the first pipeline 28, to change to a flow of an inert gas such as $N_2$ in order to remove moisture from within the vacuum exhaust system 20 and dilute the atmosphere of nitric oxide. A pneumatic control valve 31 is provided in this inert gas supply pipe 30. Pressure sensors 32 and 33 are also provided in the first pipeline 28, with the pressure sensor 32 being able to detect a range of, for example, 0 to 1000 Torr and the pressure sensor 33 being able to detect a range of, for example, 0 to 10 Torr and being connected by a pneumatic control valve 34.

A pressure sensor 35 for detecting the pressure at the immediately upstream side of the vacuum pump 27 is connected by a manual valve 36 to the second pipeline 29. Downstream of the vacuum pump 27 are provided a trap 37 for removing drain water and switching valves 38 and 39, which switch between a diffusion system wherein the exhaust is a gas such as nitric oxide and an acidic treatment system for moisture and gases such as HCl, with the configuration being such that the exhausts therefrom are processed by a scrubber device. Note that the oxidation treatment apparatus of the above configuration has a leak-tight structure capable of exhaust under highly reduced pressure, such as by the provision of a seal means such as an O-ring in each connection portion of the exhaust system of the treatment furnace 1. In addition, the oxidation treatment apparatus is configured in such a manner that components such as the combustion device 8, the heater 6, the switching valves 21 and 22, and the multiple-function valve 26 are controlled by a control device 40 to which are input different programs for a previously determined oxidation treatment method, whereby a desired oxidation treatment method is executed automatically.

Figure 2:
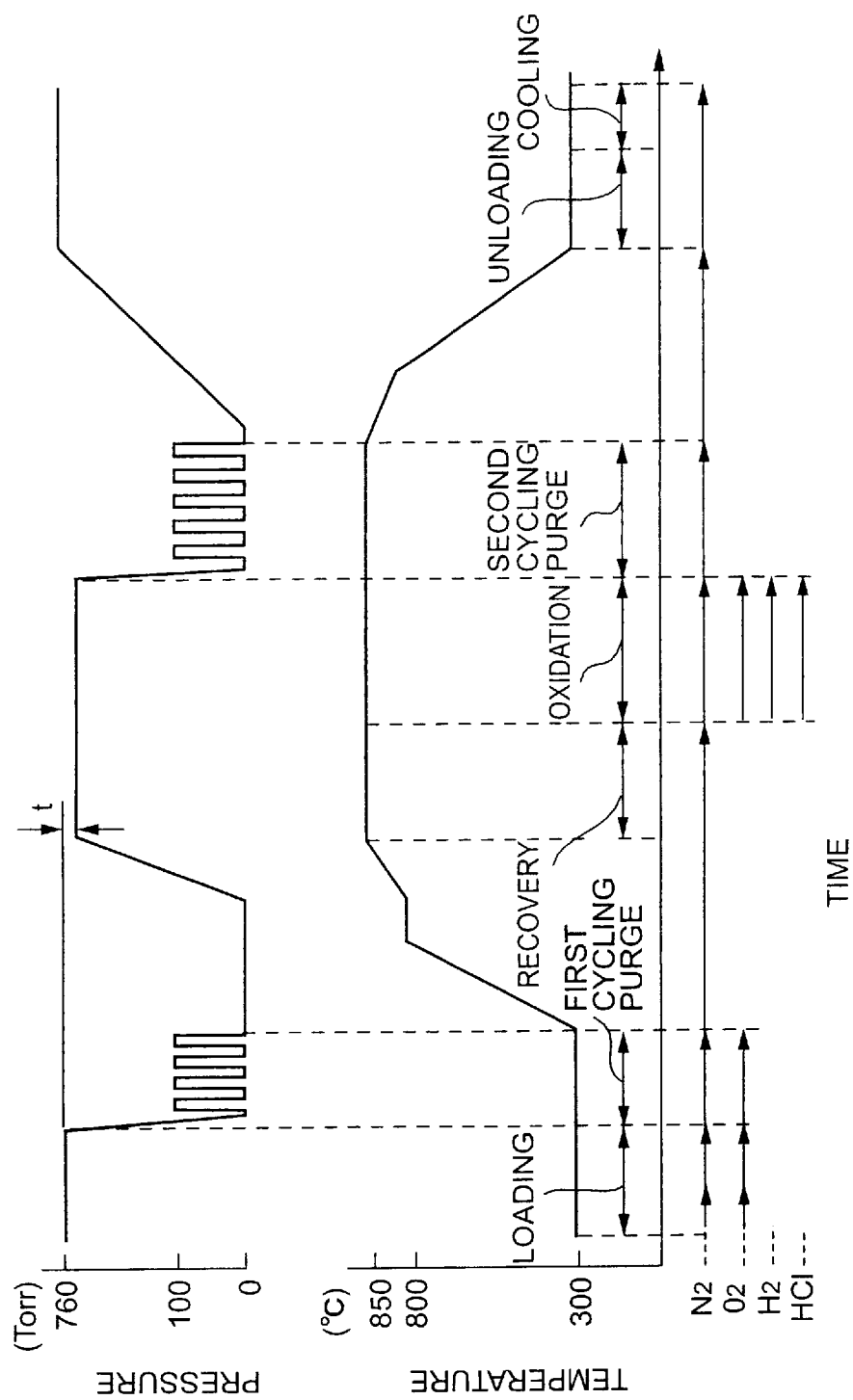
FIG. 2 is an illustrative graph of an example of an oxidation treatment method performed by this oxidation treatment apparatus.

The operation of the above described oxidation treatment apparatus will be described with reference to FIG. 2. In FIG. 2, pressure and temperature within the treatment furnace 1 are plotted along the vertical axis and time is plotted along the horizontal axis. First of all, the interior of the treatment furnace 1 is opened to the atmosphere initially and is also heated and controlled by the heater 6 to a previously determined temperature, such as 300° C., the wafer boat 4 holding a large number of semiconductor wafers W is loaded into the treatment furnace 1 in that state and the lid 3 seals the entrance of the treatment furnace 1, then the pressure within the treatment furnace 1 is reduced by evacuation by the vacuum exhaust system 20. This pressure reduction or evacuation preferably comprises a cycling purge (a first cycling purge). During this loading and first cycling purge, an inert gas such as $N_2$ is supplied into the treatment furnace to ensure that no natural oxide films form on the surfaces of the semiconductor wafers W. In addition, if the $N_2$ were 100%, nitrides would form on the surfaces of the semiconductor wafers W, which would make it difficult for the surfaces of the semiconductor wafers W to be oxidized during the subsequent oxidation step, so a small quantity of $O_2$ on the order of 1% is also supplied in order to prevent this.

The first cycling purge is performed by alternately supplying and halting the supply of inert gas such as $N_2$ to the interior of the treatment furnace 1 while it is being evacuated. In such a case, the exhaust system is switched to the vacuum exhaust system 20 by the switching valves 21 and 22, then the interior of the treatment furnace 1 is evacuated to a predetermined pressure, such as $10^{-3}$ Torr under the control of the multiple-function valve 26 by the operation of the vacuum pump 27, while the pressure is being detected by the pressure sensors 32 and 33. The first cycling purge is performed in this pressure-reduction exhaust state by intermittently supplying the inert gas such as $N_2$, which is controlled to a predetermined flowrate, by repeatedly opening and closing the inert gas supply valve, thus making it possible to rapidly reduce the pressure within the treatment furnace 1 and thoroughly replace the atmosphere therein with the inert gas. In other words, this first cycling purge makes it possible to rapidly reduce the pressure (shorten the vacuum achievement time) and replace the atmosphere.

Next, the interior of the treatment furnace 1 is heated in this reduced-pressure evacuated state to the predetermined treatment temperature, such as 850° C., under the control of the heater 6, the interior of the treatment furnace 1 is controlled to a slightly reduced pressure t (see FIG. 2), such as between approximately −5 mm $H_2O$ and −10 mm $H_2O$ with respect to atmospheric pressure (760 Torr) by switching the exhaust system to the factory exhaust system 19 by closing the switching valve 22 and opening the switching valve 21. Then, after "recovery" has been performed in this state (to allow the temperature of the semiconductor wafers to stabilize), and a predetermined oxidation treatment, such as HCl oxidation, is performed. This oxidation treatment is performed by supplying oxygen ($O_2$) and hydrogen ($H_2$) into the combustion device 8 where they are burnt, and a slightly reduced pressure state is created by supplying the thus generated water steam into the treatment furnace 1 together with hydrogen chloride (HCl) and an inert gas such as $N_2$.

When the oxidation treatment step is completed, the procedure is such that the exhaust system is switched to the vacuum exhaust system 20, and, once the pressure within the treatment furnace 1 has been reduced by another vacuum evacuation, the temperature within the treatment furnace 1 is reduced under the control of the heater 6 to a predetermined temperature of, for example, 300° C. and, in parallel thereto, the interior of the treatment furnace 1 is returned to normal pressure, the wafer boat 4 is unloaded from within the treatment furnace 1, and cooling is performed (to cool the semiconductor wafers to a temperature at which they can be conveyed). The pressure reduction or vacuum evacuation after this oxidation treatment step is completed preferably comprises another cycling purge (a second cycling purge).

Thus, in this method of performing an oxidation treatment on semiconductor wafers W, wherein the semiconductor wafers W are accommodated within the treatment furnace 1 that has been heated beforehand to a predetermined temperature, the temperature within the treatment furnace 1 is increased to a predetermined treatment temperature, and water steam is supplied as a treatment gas, the temperature-increasing step is performed under a reduced pressure, which makes it possible to increase the temperature of the semiconductor wafers W from a predetermined temperature in a state in which the causes of natural oxidation are reduced by lowering the density of oxygen, which makes it possible to suppress the formation of natural oxide films in the temperature-increasing step, and which thus makes it possible to form an extremely thin oxide film of a superior quality. In addition, since the configuration is such that the pressure within the treatment furnace 1 is reduced by vacuum evacuation not only before the step of performing the desired oxidation treatment, but also after that step, it is possible to satisfactorily remove the causes of excess natural oxidation on portions outside of the desired oxidation treatment step and thus suppress the formation of unwanted natural oxide films, which makes it possible to form an extremely thin oxide film of a superior quality, with uniform film quality and film thickness. Incidentally, it is possible to form an $SiO_2$ film of a thickness on the order of 2 nm.

Since the above described step of reducing the pressure or vacuum-evacuating the treatment furnace 1 comprises a process called cycling purge, it is possible to reduce the pressure and replace the atmosphere rapidly, which can be expected to improve the throughput. In addition, it is possible to implement this oxidation treatment method accurately and simply because the above described oxidation treatment apparatus is provided with the combustion device 8 which is a water steam supply means for supplying water steam into the treatment furnace 1, the factory exhaust system 19 which exhausts the interior of the treatment furnace 1 to a slightly reduced pressure during the oxidation treatment step, the vacuum exhaust system 20 which evacuates the interior of the treatment furnace 1 after the oxidation treatment step, and the switching valves 21 and 22 which switch between the factory exhaust system 19 and the vacuum exhaust system 20.

In this case, the combustion device 8 is configured in such a manner as to be capable of supplying a very small flowrate of water steam, making it possible to form an extremely thin oxide film with an even more superior quality, by taking sufficient time for forming such a film. Furthermore, the multiple-function valve 26 and vacuum pump 27 are provided in the vacuum exhaust system 20, and this single multiple-function valve 26 is provided with the two functions of opening/closing and adjusting the pressure, so that the number of valves can be reduced and thus the structure of the vacuum exhaust system 20 can be simplified, which reduces costs.

Figure 3:
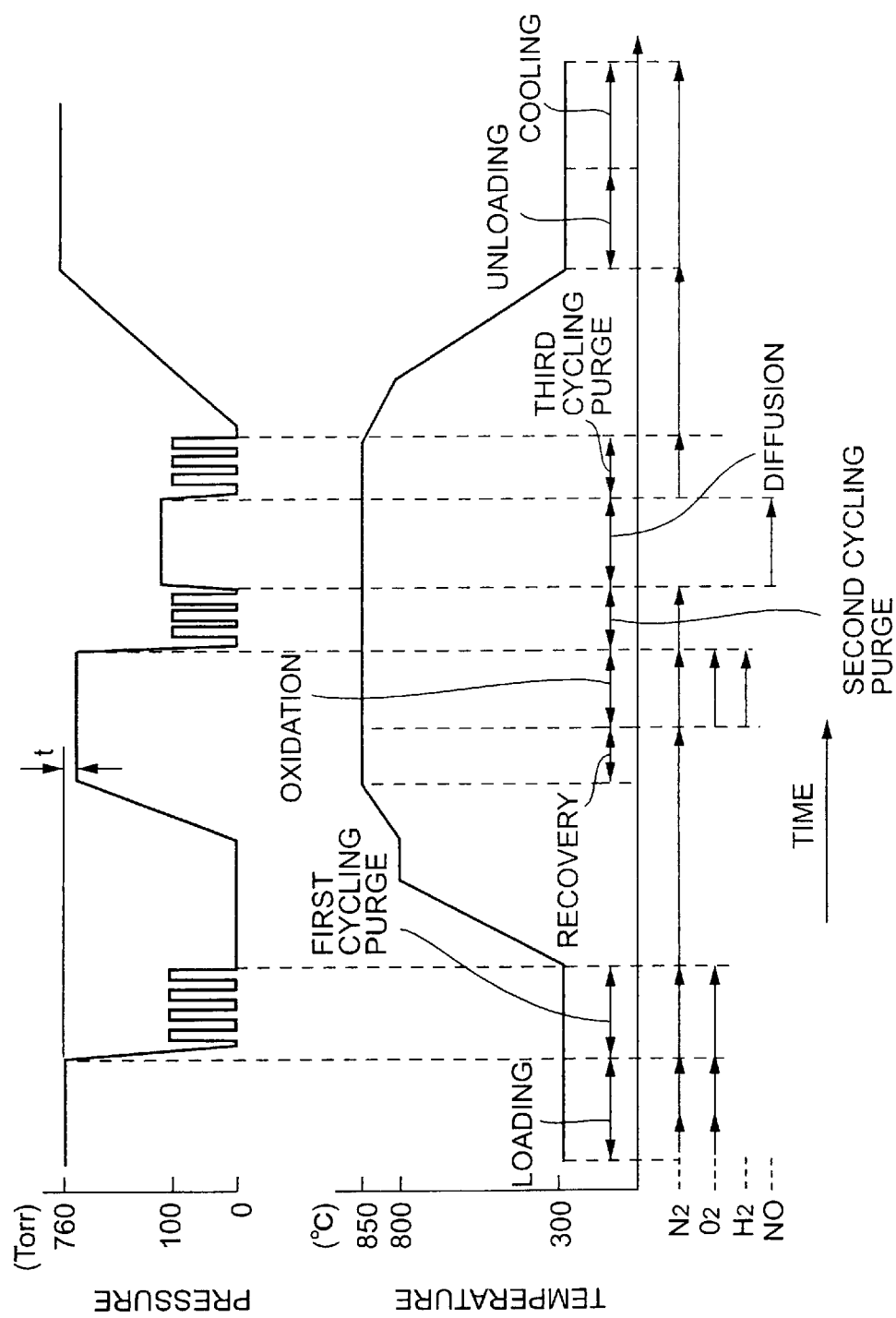
FIG. 3 is another illustrative graph of the oxidation treatment method.

Note that, as shown in FIG. 3, the oxidation treatment may include a nitrogen diffusion treatment such that, after a desired oxidation treatment step, either nitric oxide (NO) or nitrous oxide ($N_2O$) is supplied in a state in which the pressure within the treatment furnace 1 is reduced and controlled to approximately 100 Torr. It is preferable that the pressure within the treatment furnace 1 is reduced by vacuum evacuation before and after this nitrogen diffusion step, and also that cycling purges (a second cycling purge and a third cycling purge) are performed during that time. Since the nitric oxide (NO) or nitrous oxide ($N_2O$) is supplied after moisture has been thoroughly removed from the interior of the treatment furnace by the second cycling purge and third cycling purge, after wet etching, it is possible to satisfactorily suppress the generation of the highly corrosive nitric acid ($HNO_3$) and also form a highly insulating SiON film, which makes it easy to improve the process to produce a highly reliable film quality.

Figure 4:
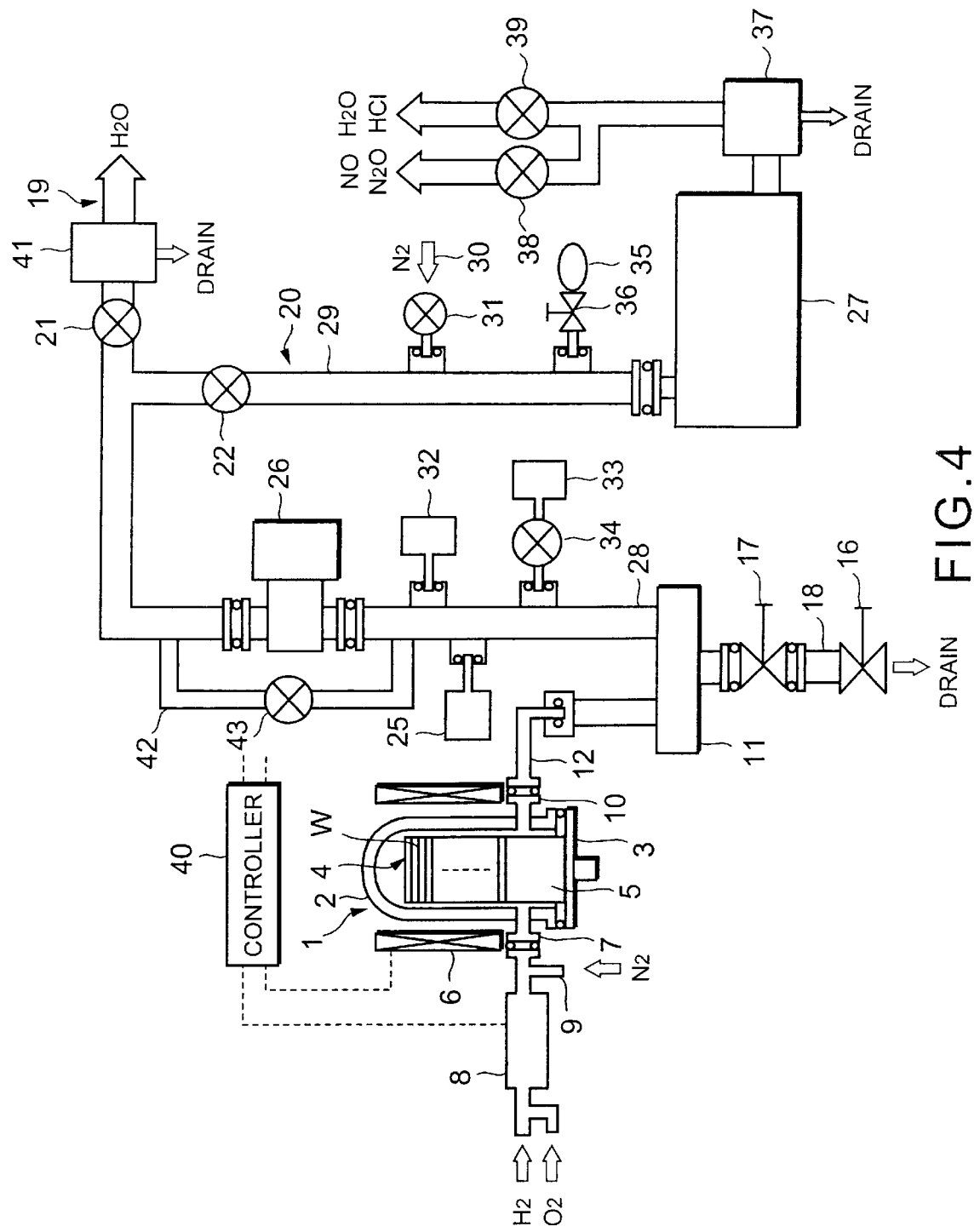
FIG. 4 is a side view of the entire structure of an oxidation treatment apparatus in accordance with a second embodiment of this invention.

The entire structure of an oxidation treatment apparatus in accordance with a second embodiment of this invention is shown in FIG. 4. Components in this embodiment that are the same as those in the first embodiment are given the same reference numbers and further description thereof is omitted; only portions that differ are described hereunder. The condensate pipeline 14 and the second duct 15 are not provided in the first duct 11, the multiple-function valve 26 made of Teflon (trademark) is connected thereto by the first pipeline 28, which is made of Teflon or the like, the vacuum pump 27 is connected by the second pipeline 29 of the same Teflon by this multiple-function valve 26, and thus the vacuum exhaust system 20 is configured.

The pressure switch 25 and pressure sensors 32 and 33 are provided in the first pipeline 28. The factory exhaust system 19 is provided branching off of the second pipeline 29, and also the switching valves 21 and 22 for switching the factory exhaust system 19 and the vacuum exhaust system 20 are provided therein. A trap 41 is provided in the factory exhaust system 19. In addition, the inert gas supply pipe 30 and the pressure sensor 35 are provided in the second pipeline 29, connected thereto by the respective valves 31 and 36. A bypass pipe 42 that bypasses the multiple-function valve 26 is provided in the first pipeline 28 and the second pipeline 29. In the bypass pipe 42, a bypass valve 43 is provided which is open when the factory exhaust system 19 is in use and closed when the vacuum exhaust system 20 is in use.

The oxidation treatment apparatus of this embodiment achieves the same operational effects as the oxidation treatment apparatus of the previous embodiment.

Figure 5:
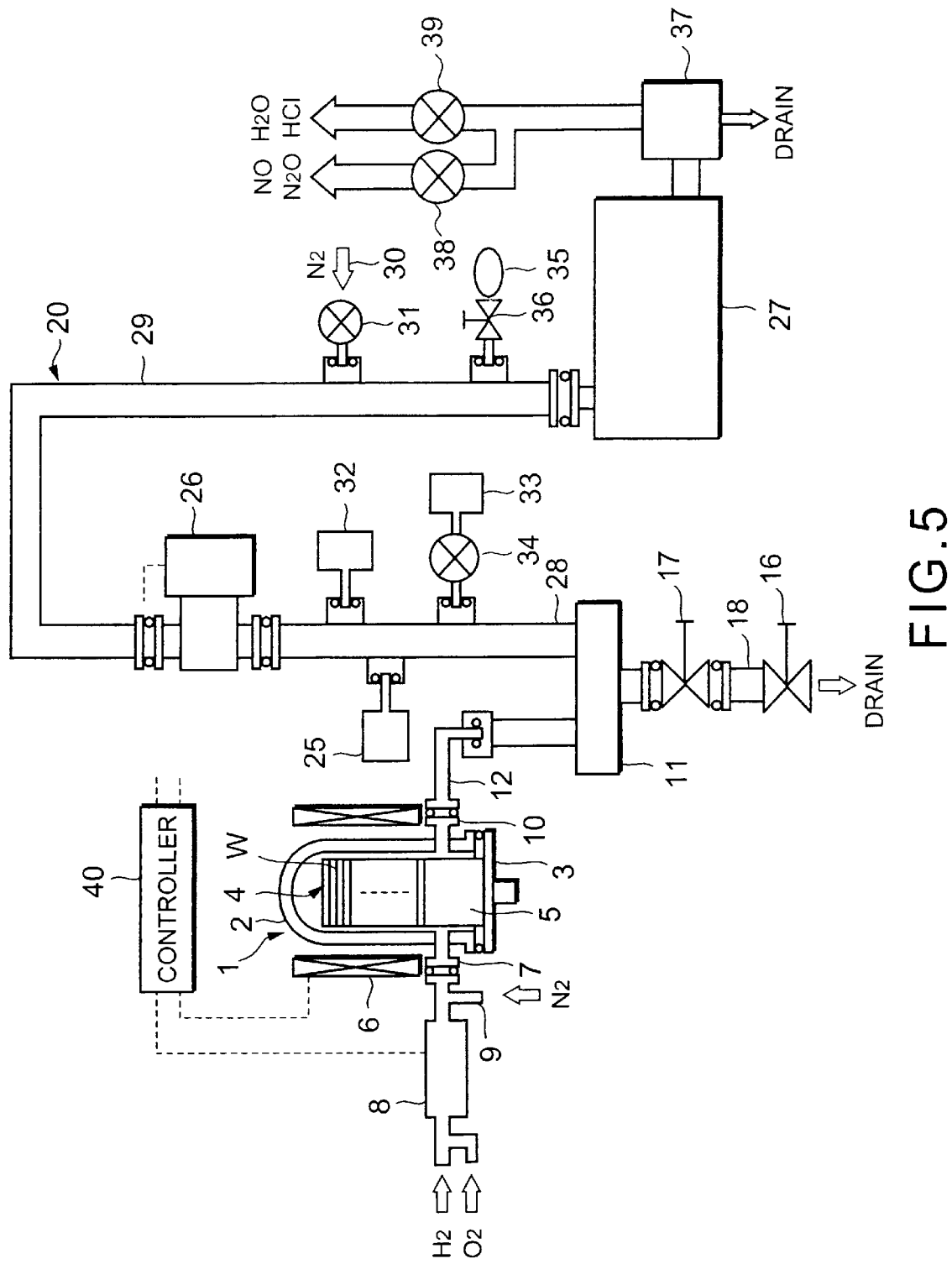
FIG. 5 is a side view of the entire structure of an oxidation treatment apparatus in accordance with a third embodiment of this invention.

The entire structure of an oxidation treatment apparatus in accordance with a third embodiment of this invention is shown in FIG. 5. Components in this embodiment that are the same as those in the second embodiment are given the same reference numbers and further description thereof is omitted; only portions that differ are described hereunder. The bypass pipe 42 is not provided for the first pipeline 28 and the second pipeline 29, and the factory exhaust system 19 is not provided branching off of the second pipeline 29. It is preferable that a heater is provided in the second pipeline 29 for removing moisture. The multiple-function valve 26 is made of a material such as Teflon (trademark) and is configured so as to be capable of opening and closing, and also of adjusting the pressure between atmospheric pressure to a predetermined vacuum pressure.

In other words, the oxidation treatment apparatus of this embodiment is provided with the combustion device 8 which is a water steam supply means for supplying water steam into the treatment furnace 1; the vacuum exhaust system 20, which has the vacuum pump 27 for reducing the pressure within the treatment furnace 1, which is capable of replacing the atmosphere within the treatment furnace 1 with an inert gas while exhausting the treatment furnace 1 before and after the oxidation step, and which is also preferably capable of performing cycling purges; and the multiple-function valve 26, which is provided in this vacuum exhaust system 20 and which is capable of opening and closing and also of adjusting the pressure from atmospheric pressure to a predetermined vacuum pressure. For this reason, it is possible to form an extremely thin oxide film with superior quality, without requiring a factory exhaust system.

The present invention has been described above with reference to the accompanying drawings but it should be understood that this invention is not limited to these embodiments and thus various different designs and modifications are possible within the scope of this invention. For example, the above embodiments were described as relating to the execution of an oxidation treatment while the interior of the treatment furnace is being exhausted to a slightly reduced temperature by a factory exhaust system, but, since a vacuum exhaust system is also provided, the oxidation treatment can also be performed while the interior of the treatment furnace is being evacuated by the vacuum exhaust system to a lower pressure.

The treatment furnace was described herein as being a vertical furnace operating on a batch system, by way of example, but it can equally well be a horizontal furnace or a furnace that operates on a wafer to wafer. The object to be treated is not limited to a semiconductor wafer; it could also be an LCD substrate or a glass substrate. The steam supply means is also not limited to a combustion type of device; it could be of a carburetor type, a catalytic type, or a boiling type, by way of example.

The present invention as described above achieves the effects below.

In the method of subjecting an object to be treated to an oxidation treatment in accordance with this invention, the object to be treated is accommodated within a treatment furnace that has been heated beforehand to a predetermined temperature, the temperature within the treatment furnace is increased to a predetermined treatment temperature, and a treatment gas is supplied thereto, the temperature-increasing step is performed under a reduced pressure so that it is possible to suppress the formation of natural oxide films in the temperature-increasing step, which thus makes it possible to form an extremely thin oxide film of a superior quality.

Since the pressure within the treatment furnace is reduced after the oxidation treatment step, it is possible to suppress the formation of natural oxide films after the oxidation treatment step, thus making it possible to form an extremely thin oxide film of an even more superior quality.

If this pressure reduction also comprises a cycling purge that imparts pressure changes by repeating the supply and halting of an inert gas while the interior of the treatment furnace is being evacuated, it is possible to rapidly reduce the pressure within the treatment furnace, even in confined regions such as crevices or clearances within the treatment furnace, thus improving the throughput.

Furthermore, in a method of oxidation treatment wherein an object to be treated is accommodated within a treatment furnace, a treatment gas is supplied thereto, and the temperature is increased to a predetermined treatment temperature, the interior of the treatment furnace is evacuated before and after the oxidation treatment step so that it is possible to suppress the formation of natural oxide films on portions outside of the oxidation treatment step, which makes it possible to form an extremely thin oxide film of a superior quality.

It is also possible to improve the process to produce a highly reliable film quality, by performing a diffusion treatment after the oxidation treatment step, by supplying nitric oxide or nitrous oxide into the treatment furnace.

If this vacuum evacuation step also comprises a cycling purge repeating the supply and halting of an inert gas while the interior of the treatment furnace is being evacuated, it is possible to achieve a rapid evacuation of the treatment furnace, thus improving the throughput.

In addition, in the oxidation treatment apparatus of this invention, wherein an object to be treated is accommodated within a treatment furnace, a treatment gas is supplied thereto, and the temperature is increased to a predetermined treatment temperature, the apparatus is also provided with a treatment gas supply means for supplying a treatment gas into the treatment furnace, a factory exhaust system for exhausting the interior of the treatment furnace to a predetermined exhaust pressure, a vacuum exhaust system for evacuating the interior of the treatment furnace to a pressure that is lower than the exhaust pressure of the factory exhaust system, and a switching means for switching between the factory exhaust system and the vacuum exhaust system, so that it is possible to suppress the formation of natural oxide films on portions outside of the oxidation treatment step, which makes it possible to form an extremely thin oxide film of a superior quality.

The structure of the vacuum exhaust system can be simplified by providing the vacuum exhaust system with a multiple-function valve, which is capable of opening/closing and adjusting the pressure, and a vacuum pump, thus reducing costs.

In the oxidation treatment apparatus of this aspect of the invention,where in an object to betreated is accommodated within a treatment furnace, a treatment gas is supplied thereto, and the temperature is increased to a predetermined treatment temperature, the apparatus is also provided with a treatment gas supply means for supplying a treatment gas into the treatment furnace, a vacuum exhaust system having a vacuum pump for reducing the pressure and exhausting the interior of the treatment furnace, and a multiple-function valve which is provided in this vacuum exhaust system and which is capable of opening and closing and also of adjusting the pressure from atmospheric pressure to a predetermined vacuum pressure, so that it is possible to form an extremely thin oxide film with superior quality, without requiring a factory exhaust system.

What is claimed is:

1. An oxidation treatment method comprising the steps of:
   accommodating an object to be treated within a treatment furnace that has been heated beforehand to a predetermined first temperature;
   raising a temperature within said treatment furnace to a predetermined second temperature for a predetermined treatment, which second temperature is higher than said first temperature;
   subjecting said object to be treated to an oxidation treatment by supplying a treatment gas into said treatment furnace that has been raised to said second temperature; and
   reducing a pressure within said treatment furnace, during said step of raising a temperature within said treatment furnace to said second temperature.

2. The oxidation treatment method as defined in claim 1, further comprising the step of:
   further reducing the pressure within said treatment furnace, after said step of subjecting the object to oxidation treatment.

3. The oxidation treatment method as defined in claim 2, wherein said step of further reducing the pressure comprises:
   a cycling purge of alternately repeating supply and halting of an inert gas into an interior of said treatment furnace, while the interior of said treatment furnace is being evacuated.

4. The oxidation treatment method as defined in claim 1, wherein said step of reducing the pressure comprises:
   a cycling purge of alternately repeating supply and halting of an inert gas into an interior of said treatment furnace, while the interior of said treatment furnace is being evacuated.

5. An oxidation treatment method comprising the steps of:
   accommodating an object to be treated within a treatment furnace;
   subjecting said object to be treated to an oxidation treatment at a predetermined temperature by supplying a treatment gas into said treatment furnace;
   performing a diffusion treatment bv supplivng nitric oxide or nitrous oxide into said treatment furnace, after said step of subjecting said object to an oxidation treatment; and
   evacuating an interior of said treatment furnace, before said step of subjecting said object to an oxidation treatment.

6. The oxidation treatment method as defined in claim 5, further comprising the step of:
   reducing a pressure within said treatment furnace, after said step of subjecting the object to an oxidation treatment.

7. The oxidation treatment method as defined in claim 5, wherein said evacuating step comprises:
   a cycling purge of alternately repeating supply and halting of an inert gas into the interior of said treatment furnace, while the interior of said treatment furnace is being evacuated.

8. The oxidation treatment apparatus comprising:
   a treatment furnace for accommodating an object to be treated;

a system for maintaining an interior of said treatment furnace at a predetermined treatment temperature; and a system for subjecting said object to be treated to an oxidation treatment at said predetermined treatment temperature by supplying a treatment gas into the interior of said treatment furnace;

a factory exhaust system for exhausting the interior of said treatment furnace at a predetermined exhaust pressure;

a vacuum exhaust system for evacuating the interior of said treatment furnace to a pressure lower than the exhaust pressure of said factory exhaust system;

a switching system for switching between said factory exhaust system and said vacuum exhaust system, said switching system including a first valve in said factory exhaust system and a second valve in said vacuum exhaust system; and a drain passage provided between said treatment furnace and said first and second valves to remove drain water produced from water vapor included in an exhaust gas from the treatment furnace.

9. The oxidation treatment apparatus as defined in claim 8, wherein said vacuum exhaust system comprises:

a multiple-function valve capable of opening, closing, and adjusting pressure; and a vacuum pump.

10. An oxidation treatment apparatus comprising:

a treatment furnace for accommodating an object to be treated;

a system for maintaining an interior of said treatment furnace at a predetermined treatment temperature;

a system for subjecting said object to be treated to an oxidation treatment at said predetermined treatment temperature by supplying a treatment gas into the interior of said treatment furnace;

a vacuum exhaust system having a vacuum pump for reducing a pressure in the interior of said treatment furnace;

and a single-piece multiple-function valve provided in said vacuum exhaust system, for opening, closing, and adjusting pressure within a range from atmospheric pressure to a vacuum pressure.

11. The oxidation treatment apparatus as defined in claim 10, further comprising:

a bypass pipe provided to bypass said multiple-fiction valve; and a bypass valve provided in said bypass pipe, said bypass valve opening when said factory exhaust system is used and closing when said vacuum exhaust system is used.

* * * * *